(12) United States Patent
Miyazawa et al.

(10) Patent No.: US 12,334,427 B2
(45) Date of Patent: Jun. 17, 2025

(54) SEMICONDUCTOR DEVICE

(71) Applicant: Mitsubishi Electric Corporation, Tokyo (JP)

(72) Inventors: Masaomi Miyazawa, Tokyo (JP); Satoshi Miyahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 487 days.

(21) Appl. No.: 17/823,392

(22) Filed: Aug. 30, 2022

(65) Prior Publication Data

US 2023/0170292 A1  Jun. 1, 2023

(30) Foreign Application Priority Data

Nov. 30, 2021  (JP) .................. 2021-193832

(51) Int. Cl.
*H01L 23/00* (2006.01)
*H01L 23/50* (2006.01)
*H01L 25/07* (2006.01)

(52) U.S. Cl.
CPC .............. *H01L 23/50* (2013.01); *H01L 24/45* (2013.01); *H01L 25/072* (2013.01); *H01L 2224/451* (2013.01)

(58) Field of Classification Search
CPC ....... H01L 23/50; H01L 24/45; H01L 25/072; H01L 2224/451; H01L 24/42; H01L 25/18; H01L 23/49; H01L 23/481; H02M 7/487; H02M 7/003; H02M 1/00; H02M 7/48

See application file for complete search history.

(56) References Cited

FOREIGN PATENT DOCUMENTS

JP  2019-162032 A  9/2019

*Primary Examiner* — Elias Ullah
(74) *Attorney, Agent, or Firm* — Studebaker Brackett PLLC

(57) ABSTRACT

A semiconductor device includes a first bus bar, a second bus bar, a first terminal, and a second terminal. The first terminal includes one or more planar portions, and the second terminal includes one or more planar portions. The one or more planar portions of the first terminal and the one or more planar portions of the second terminal are arranged parallel to and opposite each other. One of the first bus bar and the second bus bar covers a gap between a portion of the first terminal connected to the first bus bar and a portion of the second terminal connected to the second bus bar in plan view.

8 Claims, 3 Drawing Sheets

SEMICONDUCTOR DEVICE

BACKGROUND OF THE INVENTION

Field of the Invention

The present disclosure relates to semiconductor devices.

Description of the Background Art

A three-level inverter circuit including a plurality of semiconductor elements connected to form a T-shape has recently been proposed as a semiconductor device (e.g., Japanese Patent Application Laid-Open No. 2019-162032).

In technology disclosed in Japanese Patent Application Laid-Open No. 2019-162032, inductance can be reduced by a laminate substrate only in a portion of the circuit where a current flows parallel to the laminate substrate. In a portion of the circuit where a current flows perpendicular to the laminate substrate, however, columnar terminals are arranged independently of one another, resulting in a relatively large inductance.

SUMMARY

The present disclosure has been conceived in view of a problem as described above, and it is an object of the present disclosure to provide technology enabling reduction in inductance of a semiconductor device.

A semiconductor device according to the present disclosure includes: a first power module and a second power module; and a first bus bar and a second bus bar connected to the second power module. The first power module includes: a first switching element and a second switching element; and a first diode and a second diode respectively connected in anti-parallel with the first switching element and the second switching element. The second power module includes: a third switching element and a fourth switching element; a third diode and a fourth diode respectively connected in anti-parallel with the third switching element and the fourth switching element; a first terminal electrically connected to the third switching element, electrically connected to a connection point of the first switching element and the second switching element via the first bus bar, and including one or more planar portions; and a second terminal electrically connected to the fourth switching element, electrically connected to an intermediate potential point of a power supply via the second bus bar, and including one or more planar portions. The one or more planar portions of the first terminal and the one or more planar portions of the second terminal are arranged parallel to and opposite each other, and one of the first bus bar and the second bus bar covers a gap between a portion of the first terminal connected to the first bus bar and a portion of the second terminal connected to the second bus bar in plan view.

Inductance of the semiconductor device can be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiments will be described below with reference to the accompanying drawings. Features described in the embodiments below are examples, and all the features are not necessarily required. In description made below, similar components in the embodiments bear the same or similar reference signs, and different components will mainly be described. In description made below, specific locations and directions represented by terms such as "upper", "lower", "left", "right", "front", and "back" may not necessarily match locations and directions in actual implementation.

Embodiment 1

Figure 1:
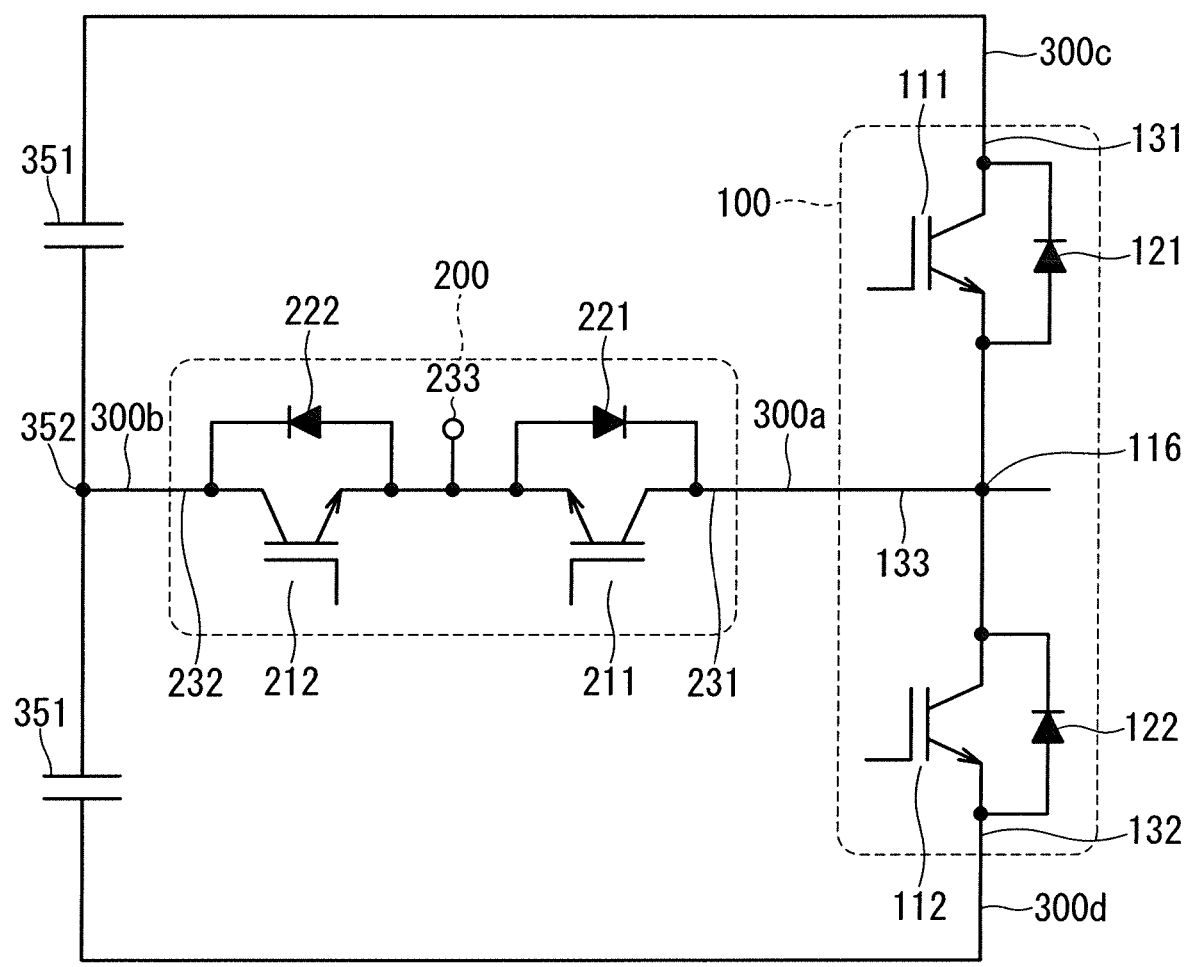
FIG. 1 is a circuit diagram showing a configuration of a semiconductor device according to Embodiment 1.
Figure 2:
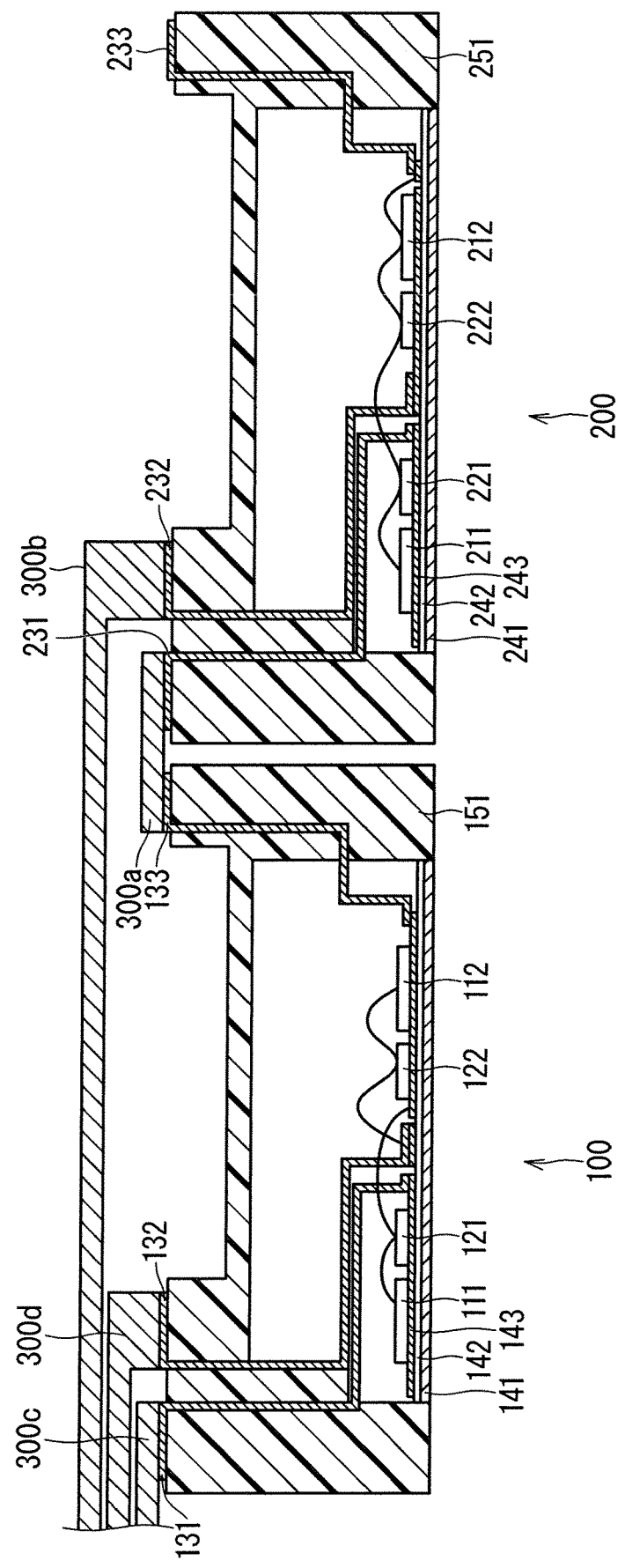
FIG. 2 is a cross-sectional view showing the configuration of the semiconductor device according to Embodiment 1.

FIG. 1 is a circuit diagram showing a configuration of a semiconductor device according to Embodiment 1, and FIG. 2 is a cross-sectional view showing the configuration. As shown in FIG. 1, the semiconductor device according to Embodiment 1 forms a three-level power converter, such as a three-level inverter circuit.

The semiconductor device in FIG. 2 includes a first power module 100, a second power module 200, a first bus bar 300a, a second bus bar 300b, a third bus bar 300c, and a fourth bus bar 300d.

The first bus bar 300a and the second bus bar 300b are connected to the second power module 200, and the third bus bar 300c and the fourth bus bar 300d are connected to the first power module 100. The first bus bar 300a to the fourth bus bar 300d are planar metal plates each made of copper (Cu) or aluminum (Al), for example.

<First Power Module>

As shown in FIG. 2, the first power module 100 includes a first switching element 111, a second switching element 112, a first diode 121, a second diode 122, a third terminal 131, a fourth terminal 132, and a sixth terminal 133. The first power module 100 also includes a third metal layer 141, an insulating layer 142, a fourth metal layer 143, and a case 151.

The first switching element 111 is an insulated gate bipolar transistor (IGBT) in an example of FIG. 1, but may be a semiconductor switching element, such as a metal oxide semiconductor field effect transistor (MOSFET).

The first diode 121 is connected in anti-parallel with the first switching element 111. That is to say, a forward direction of the first diode 121 is opposite a direction of normal current flow of the first switching element 111. The first diode 121 may be a Schottky barrier diode (SBD), or may be a PN junction diode (PND).

A material for the first switching element 111 and the first diode 121 may be normal silicon (Si), or may be a wide bandgap semiconductor, such as silicon carbide (SiC), gallium nitride (GaN), and diamond. The wide bandgap semiconductor as a material for the first switching element 111 and the first diode 121 allows for stable operation at a high temperature and a high voltage and faster switching speed.

The second switching element 112 and the second diode 122 are similar to the first switching element 111 and the first diode 121, and the second diode 122 is connected in anti-parallel with the second switching element 112.

As shown in FIG. 2, the first power module 100 includes a laminate structure including the third metal layer 141, the insulating layer 142, and the fourth metal layer 143 laminated in this order. A material for the third metal layer 141 and the fourth metal layer 143 is Cu, for example, and a material for the insulating layer 142 is AlN or $Al_2O_3$, for example. The first switching element 111, the second switching element 112, the first diode 121, and the second diode 122 are connected to the fourth metal layer 143 as patterned to form a circuit of the first power module 100 in FIG. 1.

As shown in FIG. 1, the first switching element 111 and the second switching element 112 are connected at a connection point 116, and are connected in series between the third bus bar 300c and the fourth bus bar 300d. The third bus bar 300c and the fourth bus bar 300d are respectively connected to a high potential and a low potential of a power supply 351, and the first switching element 111 and the second switching element 112 form upper and lower arms of the three-level power converter. The power supply 351 is a capacitor in FIG. 1, but is not limited to the capacitor.

The case 151 in FIG. 2 has an interior space to contain the first switching element 111, the second switching element 112, the first diode 121, and the second diode 122. On the other hand, the third metal layer 141 is exposed from the case 151.

First ends of the third terminal 131, the fourth terminal 132, and the sixth terminal 133 are located in the interior space of the case 151. Second ends of the third terminal 131, the fourth terminal 132, and the sixth terminal 133 are located external to the case 151. Each of the third terminal 131, the fourth terminal 132, and the sixth terminal 133 is formed of a bent plate-like member, and includes one or more planar portions.

As shown in FIGS. 1 and 2, the first end of the third terminal 131 is electrically connected to the first switching element 111, and the second end of the third terminal 131 is electrically connected to the third bus bar 300c. The first end of the fourth terminal 132 is electrically connected to the second switching element 112, and the second end of the fourth terminal 132 is electrically connected to the fourth bus bar 300d. The first end of the sixth terminal 133 is electrically connected to the connection point 116 of the first switching element 111 and the second switching element 112, and the second end of the sixth terminal 133 is electrically connected to the first bus bar 300a.

<Second Power Module>

As shown in FIG. 2, the second power module 200 includes a third switching element 211, a fourth switching element 212, a third diode 221, a fourth diode 222, a first terminal 231, a second terminal 232, and a fifth terminal 233. The second power module 200 also includes a first metal layer 241, an insulating layer 242, a second metal layer 243, and a case 251. The second power module 200 is disposed close to the first power module 100.

The third switching element 211 and the third diode 221 are similar to the first switching element 111 and the first diode 121, and the third diode 221 is connected in antiparallel with the third switching element 211.

The fourth switching element 212 and the fourth diode 222 are similar to the first switching element 111 and the first diode 121, and the fourth diode 222 is connected in antiparallel with the fourth switching element 212. In the example of FIG. 1, a forward direction of the third diode 221 is opposite a forward direction of the fourth diode 222.

As shown in FIG. 2, the second power module 200 includes a laminate structure including the first metal layer 241, the insulating layer 242, and the second metal layer 243 laminated in this order. Materials for the first metal layer 241, the insulating layer 242, and the second metal layer 243 are similar to the materials for the third metal layer 141, the insulating layer 142, and the fourth metal layer 143. The third switching element 211, the fourth switching element 212, the third diode 221, and the fourth diode 222 are connected to the second metal layer 243 as patterned to form a circuit of the second power module 200 in FIG. 1.

As shown in FIG. 1, the third switching element 211 and the fourth switching element 212 are connected in series between the first bus bar 300a and the second bus bar 300b. The first bus bar 300a is electrically connected to the sixth terminal 133 in FIG. 2 to be electrically connected to the connection point 116 of the first switching element 111 and the second switching element 112 in FIG. 1. The second bus bar 300b is electrically connected to an intermediate potential point 352 of the power supply 351. A terminal to which an intermediate potential of the power supply 351 is applied is disposed at the intermediate potential point 352, for example.

Due to connection described above, the third switching element 211 and the fourth switching element 212 constitute an intermediate arm of the three-level power converter. As shown in FIG. 1, the first switching element 111 and the second switching element 112 and the third switching element 211 and the fourth switching element 212 are connected to form a T-shape to form a circuit of one phase of the three-level power converter.

The case 251 in FIG. 2 has an interior space to contain the third switching element 211, the fourth switching element 212, the third diode 221, and the fourth diode 222. On the other hand, the first metal layer 241 is exposed from the case 251.

First ends of the first terminal 231, the second terminal 232, and the fifth terminal 233 are located in the interior space of the case 251. Second ends of the first terminal 231, the second terminal 232, and the fifth terminal 233 are located external to the case 251. Each of the first terminal 231, the second terminal 232, and the fifth terminal 233 is formed of a bent plate-like member, and includes one or more planar portions.

As shown in FIGS. 1 and 2, the first end of the first terminal 231 is electrically connected to a back electrode of the third switching element 211, and the second end of the first terminal 231 is electrically connected to the connection point 116 in FIG. 1 via the first bus bar 300a and the sixth terminal 133. The first end of the second terminal 232 is electrically connected to a back electrode of the fourth switching element 212, and the second end of the second terminal 232 is electrically connected to the intermediate potential point 352 in FIG. 1 via the second bus bar 300b.

In the second power module 200, an emitter electrode of the third switching element 211, an anode electrode of the third diode 221, an anode electrode of the fourth diode 222, an emitter electrode of the fourth switching element 212, and the fifth terminal 233 are electrically connected by wires made of copper (Cu) or aluminum (Al), for example. Electrical connection in the second power module 200 is not limited to that described above, and is not limited to that shown in FIG. 2. On the other hand, in the first power module 100, an emitter electrode of the first switching element 111, an anode electrode of the first diode 121, a cathode electrode of the second diode 122, and a collector electrode of the second switching element 112 are electrically connected via wires and the pattern of the fourth metal layer 143, for example. An emitter electrode of the second switching element 112, an anode electrode of the second diode 122, and the fourth terminal 132 are electrically connected by wires, for example. Electrical connection in the first power module 100 is not limited to that described above, and is not limited to that shown in FIG. 2.

A potential of the fifth terminal 233 may be connected between front electrodes of the third switching element 211 and the fourth switching element 212. The potential of the fifth terminal 233 may preferably be the same as or substantially the same as a potential of the first terminal 231, that is, the fifth terminal 233 may have the same function as the first terminal 231. The fifth terminal 233 is used as an AC terminal, for example. A single second power module 200 may include a plurality of components as each of the above-mentioned components of the second power module 200. A single first power module 100 may similarly include a plurality of components as each of the above-mentioned components of the first power module 100.

<First to Fifth Terminals>

As shown in FIG. 2, the one or more planar portions of the first terminal 231 and the one or more planar portions of the second terminal 232 are arranged parallel to and opposite each other in Embodiment 1. Currents flow through the first terminal 231 and the second terminal 232 in opposite directions during operation of the three-level power converter, and, according to the above-mentioned configuration in which the planar portions are close to each other, mutual inductance when a current flows through the second power module 200 can be reduced. Parallel arrangement herein includes substantially parallel arrangement.

In Embodiment 1, the second bus bar 300b covers a gap between a portion of the first terminal 231 connected to the first bus bar 300a and a portion of the second terminal 232 connected to the second bus bar 300b in plan view. The second ends of the first terminal 231 and the second terminal 232 are thereby covered with the second bus bar 300b in plan view, so that a magnetic shielding effect can be increased, and, as a result, inductance of the second power module 200 can be reduced. Not the second bus bar 300b but the first bus bar 300a may cover the gap between the portion of the first terminal 231 connected to the first bus bar 300a and the portion of the second terminal 232 connected to the second bus bar 300b in plan view.

Furthermore, in Embodiment 1, the one or more planar portions of the third terminal 131 and the one or more planar portions of the fourth terminal 132 are arranged parallel to and opposite each other, so that mutual inductance when a current flows through the first power module 100 can similarly be reduced.

Furthermore, in Embodiment 1, the fourth bus bar 300d covers a gap between a portion of the third terminal 131 connected to the third bus bar 300c and a portion of the fourth terminal 132 connected to the fourth bus bar 300d in plan view. The second ends of the third terminal 131 and the fourth terminal 132 are thereby covered with the fourth bus bar 300d in plan view, so that the magnetic shielding effect can be increased, and, as a result, inductance of the first power module 100 can be reduced. Not the fourth bus bar 300d but the third bus bar 300c may cover the gap between the portion of the third terminal 131 connected to the third bus bar 300c and the portion of the fourth terminal 132 connected to the fourth bus bar 300d in plan view.

In Embodiment 1, the second bus bar 300b covers the gap between the portion of the third terminal 131 connected to the third bus bar 300c and the portion of the fourth terminal 132 connected to the fourth bus bar 300d in plan view. According to such a configuration, inductance of the first power module 100 can further be reduced.

In Embodiment 1, the fifth terminal 233 having the same function as the first terminal 231 of the second power module 200 is exposed from the first bus bar 300a and the second bus bar 300b in plan view. According to such a configuration, the fifth terminal 233 functioning as an output terminal of the second power module 200 can be connected to another circuit without mechanically interfering with the first bus bar 300a and the second bus bar 300b to facilitate assembly of the semiconductor device.

Embodiment 2

In Embodiment 2, a forward breakdown voltage of at least one of the third diode 221 and the fourth diode 222 is lower than a forward breakdown voltage of at least one of the first diode 121 and the second diode 122 in the configuration in Embodiment 1. For example, the third diode 221 and the fourth diode 222 have a forward breakdown voltage of 1200 V, and the first diode 121 and the second diode 122 have a forward breakdown voltage of 1700 V.

A voltage used in the second power module 200 is approximately half a voltage used in the first power module 100, so that an element having a lower breakdown voltage than that in the first power module 100 can be used in the second power module 200. A switching element connected in anti-parallel with a diode having a lower forward breakdown voltage typically has smaller conduction loss during switching operation than a switching element connected in anti-parallel with a diode having a higher forward breakdown voltage. According to Embodiment 2 having a configuration as described above, conduction loss during switching operation of the second power module 200 can be reduced.

Embodiment 3

In Embodiment 3, a voltage drop of at least one of the third switching element 211 and the fourth switching element 212 is lower than a voltage drop of at least one of the first switching element 111 and the second switching element 112 in the configurations in Embodiments 1 and 2. According to such a configuration, conduction loss of the semiconductor device can be reduced.

In Embodiment 3, a voltage drop of at least one of the third diode 221 and the fourth diode 222 is lower than a voltage drop of at least one of the first diode 121 and the second diode 122 in the configurations in Embodiments 1 and 2. According to such a configuration, conduction loss of the semiconductor device can be reduced.

Embodiment 4

Figure 3:
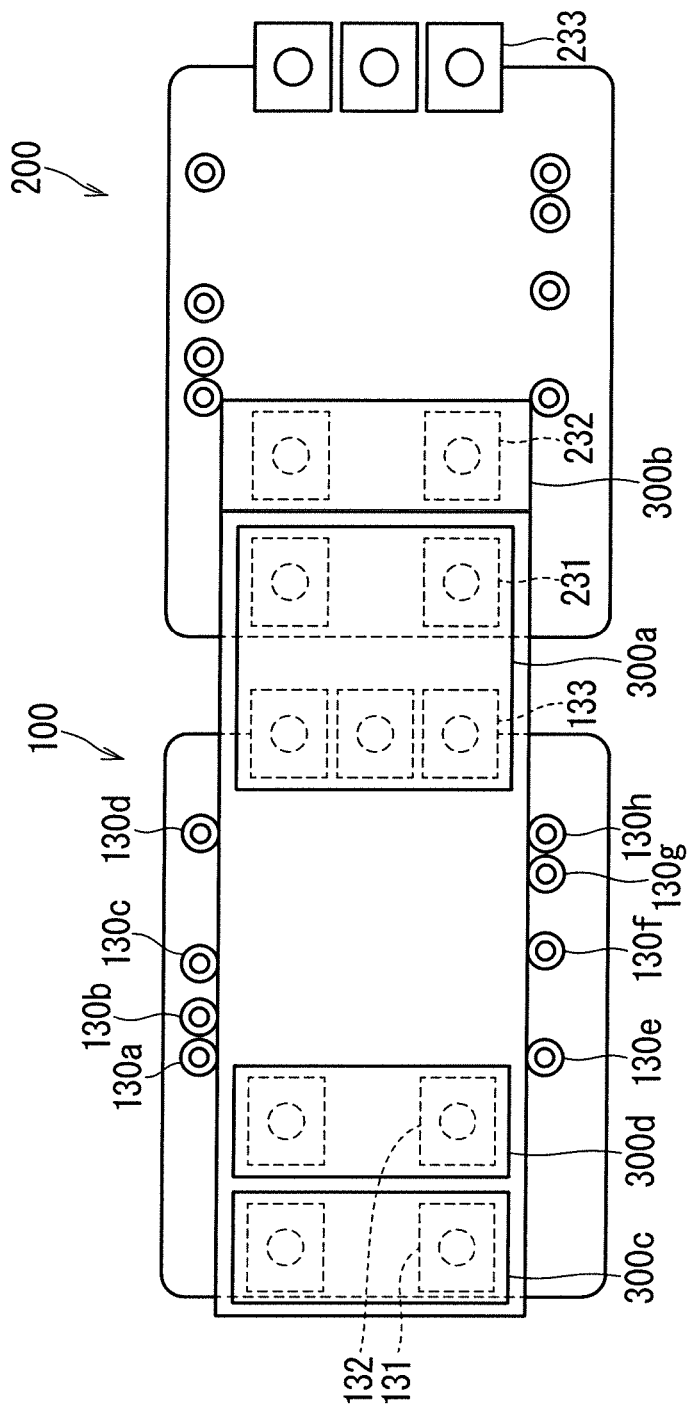
FIG. 3 is a top view showing a configuration of a semiconductor device according to Embodiment 4.

FIG. 3 is a top view showing a configuration of a semiconductor device according to Embodiment 4. The first power module 100 further includes signal terminals 130a to 130h exposed from the first bus bar 300a and the second bus bar 300b of the second power module 200 in plan view. The signal terminals 130a to 130h are gate terminals, for example. The other configuration is similar to that in Embodiments 1 to 3. According to Embodiment 4 having such a configuration, the signal terminals 130a to 130h of the first power module 100 can be connected to another circuit without mechanically interfering with the first bus bar 300a and the second bus bar 300b to facilitate assembly of the semiconductor device.

Embodiment 5

In Embodiment 5, at as one of the third switching element 211 and the fourth switching element 212 is a reverse conducting IGBT (an RC-IGBT). The RC-IGBT is an element including an IGBT and a freewheeling diode on a single chip, that is, a single semiconductor substrate. The other configuration is similar to that in Embodiments 1 to 4. According to Embodiment 5 having such a configuration, a heat dissipation area can be increased, and a temperature swing of the switching element can be suppressed, so that longer lifetime of the second power module 200 can be expected.

Embodiment 6

In Embodiment 6, the insulating layer 242 of the second power module 200 has a thickness of 0.3 mm or less. The other configuration is similar to that in Embodiments 1 to 5. According to such a configuration, an eddy current is generated in the first metal layer 241 under the insulating layer 242 when a current flows through the second metal layer 243 mechanically being in contact with the third switching element 211 and the fourth switching element 212 as the insulating layer 242 is relatively thin. The eddy current produces the magnetic shielding effect to reduce circuit inductance of the second power module 200. The insulating layer 142 of the first power module 100 may have a thickness of 0.3 mm or less. According to such a configuration, circuit inductance of the first power module 100 can be reduced.

Embodiments and modifications can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a first power module and a second power module; and
   a first bus bar and a second bus bar connected to the second power module, wherein
   the first power module includes:
      a first switching element and a second switching element; and
      a first diode and a second diode respectively connected in anti-parallel with the first switching element and the second switching element,
   the second power module includes:
      a third switching element and a fourth switching element;
      a third diode and a fourth diode respectively connected in anti-parallel with the third switching element and the fourth switching element;
      a first terminal electrically connected to the third switching element, electrically connected to a connection point of the first switching element and the second switching element via the first bus bar, and including one or more planar portions; and
      a second terminal electrically connected to the fourth switching element, electrically connected to an intermediate potential point of a power supply via the second bus bar, and including one or more planar portions,
   the one or more planar portions of the first terminal and the one or more planar portions of the second terminal are arranged parallel to and opposite each other, and
   one of the first bus bar and the second bus bar covers a gap between a portion of the first terminal connected to the first bus bar and a portion of the second terminal connected to the second bus bar in plan view.

2. The semiconductor device according to claim 1, further comprising
   a third bus bar and a fourth bus bar connected to the first power module, wherein
   the first power module further includes:
      a third terminal electrically connected to the first switching element and the third bus bar, and including one or more planar portions; and
      a fourth terminal electrically connected to the second switching element and the fourth bus bar, and including one or more planar portions,
   the one or more planar portions of the third terminal and the one or more planar portions of the fourth terminal are arranged parallel to and opposite each other, and
   one of the third bus bar and the fourth bus bar covers a gap between a portion of the third terminal connected to the third bus bar and a portion of the fourth terminal connected to the fourth bus bar in plan view.

3. The semiconductor device according to claim 1, wherein
   a forward breakdown voltage of at least one of the third diode and the fourth diode is lower than a forward breakdown voltage of at least one of the first diode and the second diode.

4. The semiconductor device according to claim 1, wherein
   a voltage drop of at least one of the third switching element and the fourth switching element is lower than a voltage drop of at least one of the first switching element and the second switching element, or
   a voltage drop of at least one of the third diode and the fourth diode is lower than a voltage drop of at least one of the first diode and the second diode.

5. The semiconductor device according to claim 1, wherein
   the first power module further includes
      a signal terminal exposed from the first bus bar and the second bus bar in plan view.

6. The semiconductor device according to claim 1, wherein
   at least one of the third switching element and the fourth switching element is an RC-IGBT.

7. The semiconductor device according to claim 1, wherein
   the second power module further includes
      a laminate structure including a first metal layer, an insulating layer, and a second metal layer laminated in this order,
   the third switching element and the fourth switching element are connected to the second metal layer, and
   the insulating layer has a thickness of 0.3 mm or less.

8. The semiconductor device according to claim 1, wherein
   the second power module further includes
      a fifth terminal exposed from the first bus bar and the second bus bar in plan view, and having the same function as the first terminal.

* * * * *